United States Patent [19]

Terada et al.

[11] Patent Number: 4,691,216
[45] Date of Patent: Sep. 1, 1987

[54] SEMICONDUCTOR MEMORY DEVICE

[75] Inventors: Yasushi Terada; Takeshi Nakayama, both of Itami, Japan

[73] Assignee: Mitsubishi Denki Kabushiki Kaisha, Tokyo, Japan

[21] Appl. No.: 811,881

[22] Filed: Dec. 20, 1985

[30] Foreign Application Priority Data

Jan. 18, 1985 [JP] Japan .................................. 60-7721

[51] Int. Cl.$^4$ ........................................... H01L 29/78
[52] U.S. Cl. .................. 357/23.6; 357/23.5; 357/41; 357/45; 365/185
[58] Field of Search .................. 357/23.5, 23.6, 41, 357/45; 365/185

[56] References Cited

U.S. PATENT DOCUMENTS 4,397,077  8/1983  Derbenwick et al. ............. 357/23.6
4,527,258  7/1985  Guterman ........................ 357/23.5

OTHER PUBLICATIONS

"High-Voltage Regulation and Process Considerations for High-Density 5V-Only E²PROM's", by Duane H. Oto et al., IEEE Journal of Solid-State Circuits, vol. SC-18, No. 5, (1983), pp. 532-538.

Primary Examiner—Edward J. Wojciechowicz
Attorney, Agent, or Firm—Lowe, Price, Leblanc, Becker & Shur

[57] ABSTRACT

A semiconductor memory device in which an output of a reference voltage generator for defining the height of a programming high-voltage pulse is changed according to the thickness of a tunnel oxide film and/or a floating gate oxide film of a memory transistor so that a shift amount of a threshold voltage of an EEPROM is maintained at a constant value if the thickness of the oxide films is deviated from a designed value.

12 Claims, 12 Drawing Figures

SEMICONDUCTOR MEMORY DEVICE

BACKGROUND OF THE INVENTION

1. Field of the Invention

The present invention relates to a semiconductor memory device and particularly to an improvement of a programming high-voltage pulse generator in a 5 V-only electrically erasable programmable read-only memory (EEPROM).

2. Description of the Prior Art

FIG. 1 is a schematic diagram showing a structure of a conventional programming high-voltage generating circuit, as disclosed in "High-Voltage Regulation and Process Considerations for High-Density 5 V-only E$^2$-PROM's" by Duane H. Oto et al., IEEE Journal of Solid-State Circuits, Vol. SC-18, No. 5 (1983), pp. 532–538. Referring to FIG. 1, the structure and the operation of the conventional circuit for generating a programming high-voltage pulse $V_{pp}$ will be described in the following.

This circuit comprises as a reference signal generating system: a reference voltage generator 1 for generating a reference voltage signal $V_{ref}$ for controlling the height of a programming high-voltage pulse $V_{pp}$ and supplying the reference voltage signal $V_{ref}$ to an RC network 5; an oscillator 2 for supplying two kinds of clock pulses not overlapping with each other to the respective gate electrodes of the MOS transistors 9 and 10 included in the RC network 5 so that the time constant of the RC network 5 is controlled; the RC network 5 for making gentle the rise of the reference voltage signal $V_{ref}$ from the reference voltage generator 1 in response to the clock signal frequency from the oscillator 2 and providing the signal $V_{ref}$ to a node A; a timer 3 for generating a pulse signal for controlling the pulse width of the high-voltage pulse $V_{pp}$; and a MOS transistor 4 turning on and off in response to the signal from the timer 3 so as to control the potential at the node A. The above-stated RC network 5 comprises a switched-capacitor 6 and a capacitor 7. The switched capacitor 6 comprises MOS transistors 9 and 10 turning on and off alternately by receiving at the gate electrodes thereof the two phase nonoverlapping clock signals from the oscillator 2 and also comprises a capacitor 11 having one electrode connected to a junction of the MOS transistors 9 and 10 and the other electrode grounded. The capacitor 7 has one electrode connected to an output terminal of switched-capacitor 6 and to the node A and the other electrode thereof is grounded. The capacitor 7 and the capacitor 11 both are formed of an oxide film formed by the same manufacturing process as for a gate oxide film of a MOS transistor on the same chip. One end of the MOS transistor 4 is connected to the node A and the other end thereof is grounded.

Further, the circuit shown in FIG. 1 comprises as a signal amplifying system: a comparator 12 for receiving and comparing the potential at the node A and a signal from a voltage divider 14 to provide an activation signal to a driver 15 if the potential at the node A is higher than the signal level from the voltage divider 14; a charge pump 13 responsive to the signal from the driver 15 to multiply the voltage so as to provide a programming high-voltage pulse $V_{pp}$ to a memory transistor (not shown) of the EEPROM and to the voltage divider 14; and the voltage divider 14 for dividing the voltage signal received from the charge pump 13 by a predetermined division ratio and providing the result of the division to the comparator 12.

FIG. 2 is a diagram showing a waveform of the programming high-voltage pulse $V_{pp}$. The height h of the pulse $V_{pp}$ is controlled by the signal from the reference voltage generator 1, a delay time (a rise time constant) $\tau$ is controlled by the RC network 5; and a pulse width w is controlled by a signal from the timer 3. Now, referring to FIGS. 1 and 2, the operation of the programming high-voltage generator will be described.

When the output signal from the timer 3 falls to the level "L", the MOS transistor 4 is brought into the OFF-state. As a result, the reference voltage signal $V_{ref}$ from the reference voltage generator circuit 1 is transmitted to the node A through the RC network 5. The RC network 5 comprises the switched-capacitor 6 and the capacitor 7 and in response to the signal from the oscillator 2, the MOS transistors 9 and 10 are turned on and off alternately so that electric charges from the reference voltage generator 1 are successively transferred. The time constant $\tau$ thereof is controlled by the signal from the oscillator 2 and the ratio of the capacitance 7 and 11. The potential at the node A serves as an input of the comparator 12, where it is compared with the output voltage $V_{pp}$ from the charge pump 13 divided by the voltage divider 14. The output signal of the comparator 12 is supplied to the driver 15 for driving the charge pump 13. The comparator 12 generates a signal for activating the driver 15 when the potential at the node A is higher than the voltage signal level from the voltage divider 14. Accordingly, the voltage obtained by dividing the voltage of the node A by a division ratio of the voltage divider 14 becomes the output signal of the charge pump 13, that is, the programming high-voltage pulse $V_{pp}$. Thus, by the above described operation, the programming high-voltage pulse is generated.

Then, when the output signal from the timer 3 attains the level "H", the MOS transistor 4 is brought into the ON-state and the potential at the node A becomes a ground potential through the MOS transistor 4. As a result, an activation signal is not generated from the comparator 12 and the generation of the programming high-voltage pulse $V_{pp}$ from the charge pump 13 is stopped.

The potential at the node A rises to the level of the reference voltage signal $V_{ref}$ with the time constant $\tau$ of the RC network 5 in response to the turn-off of the MOS transistor 4. Accordingly, the output pulse $V_{pp}$ from the charge pump 13 rises also with the time constant $\tau$. The rise of the pulse signal $V_{pp}$ is made gentle by using the RC network 5 so that too high an electric field may not be applied to the tunnel oxide film of the memory transistor of the EEPROM. In the conventional device, the rise time constant $\tau$ is set to 600 microseconds.

FIG. 3 is a sectional view showing schematically a structure of a memory transistor of an EEPROM. In FIG. 3, the memory transistor comprises: a drain 18 and a source 19 formed on the surface of a semiconductor substrate 20; a floating gate 17 formed on the drain 18 through a tunnel oxide film 21 to store a signal charge; and a control gate 16 formed on the floating gate 17 through an interlayer oxide film 23 to control the storage and the emission of a signal charge in the floating gate 17. The control gate 16 and the floating gate 17 both are normally formed of polysilicon. Therefore, the interlayer oxide film 23 is hereinafter referred to as the polysilicon-polysilicon interlayer oxide film 23 for convenience' sake. Now, the programming operation of the memory transistor will be described. The programming operation comprises an erasing mode and a writing mode. First, the operation in the erasing mode will be described.

In the erasing mode, the high-voltage pulse $V_{pp}$ from the programming high-voltage pulse generator (see FIG. 1) is supplied to the control gate 16, and the source 19, the drain 18 and the substrate 20 are grounded. More specifically, in FIG. 3, the equations $V_g = V_{pp}$ and $V_D = V_S = 0$ are established. Under this condition, a high electric field is applied to the tunnel oxide film 21. In consequence, a tunnel current flows between the drain 18 and the floating gate 17 through the tunnel oxide film 21 and electrons are injected into the floating gate 17, so that the threshold voltage of the memory transistor is increased. In other words, the erasing mode means a mode in which electrons are injected into the floating gate.

In the writing mode, the high-voltage pulse $V_{pp}$ from the high-voltage pulse generator is applied to the drain 18 ($V_D = V_{pp}$), so that the source 19 is brought into an electrically floating state and the control gate 16 and the semiconductor substrate 20 are grounded ($V_g = 0$). In this condition, electrons flow out of the floating gate 17 through the tunnel oxide film 21 so that positive charges are stored in the floating gate 17. As a result, the threshold voltage of the memory transistor is lowered.

The electric field applied to the tunnel oxide film 21 for defining a shift amount of the threshold voltage (that is, an amount of electrons flowing in and out of the floating gate 17) is determined by a ratio of a capacitance between the control gate 16 and the floating gate 17 and a capacitance between the floating gate 17 and the drain 18. When the thickness of the polysilicon-polysilicon interlayer oxide film 23 and the thickness of the tunnel oxide film 21 are varied, the electric filed applied to the tunnel oxide film 21 varies even if the same voltage is applied to the control gate 16 at the time of programming. Therefore, even if the same programming high-voltage pulse $V_{pp}$ is applied to the control gate 16 in the erasing mode, the shift amount ΔVth of the threshold voltage of the memory transistor changes in case where the thicknesses of these oxide films are varied. In the following, referring to the figures, a relation between the shift amount ΔVth of the threshold voltage and the thicknesses of the oxide films will be specifically described. Although the following description concerns only the erasing mode for convenience' sake, it is the same with the writing mode.

FIG. 4 is a graph showing a threshold voltage shift amount ΔVth obtained by computer simulation in case where the thickness of the tunnel oxide film is changed in a range of 80 Å to 100 Å with the thickness of the polysilicon-polysilicon interlayer oxide film being 800 Å. In FIG. 4, the horizontal axis represents a pulse width of the pulse $V_{pp}$ and the vertical axis represents a threshold voltage shift amount ΔVth. The potential of the pulse $V_{pp}$ applied to the control gate is set to be 21 V and the rise time constant τ thereof is 0.6 millisecond. As seen from FIG. 4, in the case of the pulse $V_{pp}$ with a pulse width of 2 milliseconds, the threshold voltage shift amount ΔVth largely changes in a range of 1.9 V to 4.5 V according to the thickness of the tunnel oxide film.

FIG. 5 is a graph showing a threshold voltage shift amount ΔVth obtained by computer simulation in case where the thickness of the polysilicon-polysilicon interlayer oxide film is changed in a range of 700 Å to 900 Å with the thickness of the tunnel oxide film being maintained 90 Å. In FIG. 5, the horizontal axis represents a pulse width of the pulse $V_{pp}$ and the vertical axis represents a threshold voltage shift amount ΔVth. The voltage of the pulse $V_{pp}$ applied to the control gate is 24 V and the rise time constant τ thereof is 1 millisecond. As seen from FIG. 5, the threshold voltage shift amount ΔVth largely changes as the thickness of the polysilicon-polysilicon interlayer oxide film changes.

Therefore, if the thicknesses of the oxide films are varied, it is necessary to change the waveform of the pulse $V_{pp}$ according to the thicknesses of the oxide films so as to obtain a constant threshold voltage shift amount ΔVth. This is because the shift of the threshold voltage is caused by the flowing-in and flowing-out of electric charges to/from the floating gate and the flowing-in and flowing-out amount of electric charges is defined by the electric field accross the tunnel oxide and therefore by the waveform of the high-voltage pulse $V_{pp}$. It is important to make the threshold voltage shift amount ΔVth constant for the purpose of securing the reliability of the EEPROM and a stable operation for reading and storing data.

In a conventional method, as described in the above cited prior art document, control is made by a program to change the level of the output signal $V_{ref}$ of the reference voltage generating circuit for each chip according to the thicknesses of the oxide films. However, the above described conventional method involves problems that the time required for a function test of an EEPROM is long and a programming circuit needs to be provided for each chip.

SUMMARY OF THE INVENTION

Therefore, the present invention is accomplished to solve the above described problems and it is an object of the present invention to provide a programming high-voltage pulse generator in which if the thicknesses of the oxide films incorporated are changed, the waveform of a pulse signal $V_{pp}$ is automatically adjusted according to the oxide film thicknesses, so that a threshold value shift amount $\Delta V_{th}$ is made constant.

To briefly state the present invention, the level of a reference voltage signal for determining the height of a programming high-voltage pulse is changed according to the thickness of a tunnel oxide film or polysilicon-polysilicon interlayer oxide film. More specifically, a reference voltage generating circuit in accordance with the present invention comprises: constant voltage generating means; voltage dividing means formed by connecting in series, a first capacitor formed of an oxide film having a thickness corresponding to the thickness of a tunnel oxide film or an oxide film between a control gate and a floating gate and a second capacitor having a constant capacitance, whereby a constant voltage from the constant voltage generating means is divided and provided as output; and voltage correcting means for providing as a reference voltage signal a voltage signal of a level according to the level of the output voltage from the voltage dividing means.

The first capacitor is preferably formed of an oxide film formed by the same manufacturing process as for a tunnel oxide film or a polysilicon-polysilicon interlayer oxide film or both of the above stated oxide films.

The second capacitor is preferably formed by the same manufacturing process as for manufacturing a gate oxide film of a MOS transistor.

As the voltage correcting means, an inverter formed by a MOS transistor is preferably utilized.

These object and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described with reference to the drawings.

Figure 6:
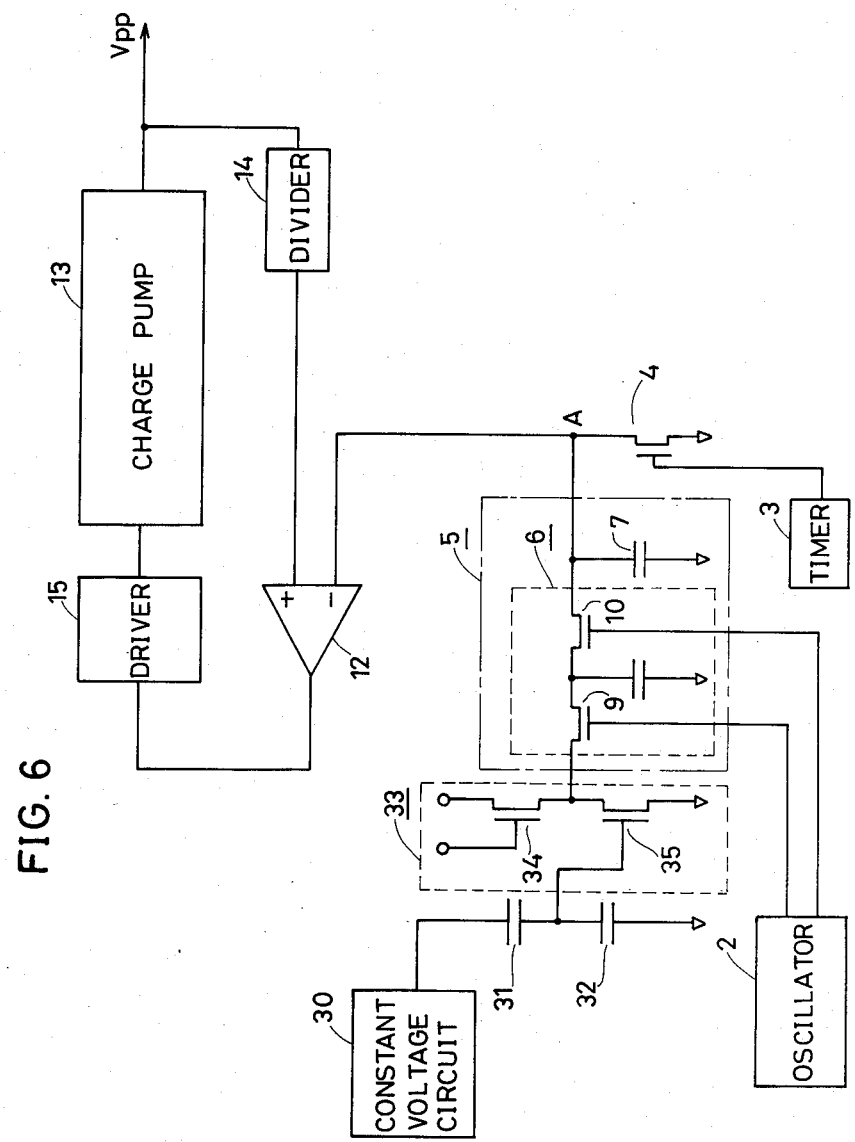
FIG. 6 is a schematic block diagram showing a structure of a programming high-voltage pulse generator in accordance with an embodiment of the present invention.

FIG. 6 is a schematic block diagram showing a structure of a programming high-voltage pulse generator including a reference voltage generating circuit in accordance with the present invention. Referring to FIG. 6, a reference voltage generating circuit comprises: a constant voltage supply circuit 30; a capacitor 31 comprised of an oxide film, the capacitor 31 receiving a constant voltage from the constant voltage supply circuit 30; a capacitor 32 comprised of an oxide film formed by the same manufacturing process as for a gate oxide film of a MOS transistor in an EEPROM; and an inverter 33 for receiving an output from a junction of the capacitor 31 and the capacitor 32. The capacitors 31 and 32 are connected in series with each other, so that a signal voltage from the constant voltage supply circuit 30 is divided by capacitance. The inverter 33 comprises enhancement type n channel MOS transistors 34 and 35 connected in series, a gate electrode of the MOS transistor 34 being connected to the power source (not shown) of the EEPROM and a gate electrode of the MOS transistor 35 being connected to the junction of the capacitors 31 and 32.

Figure 7A:
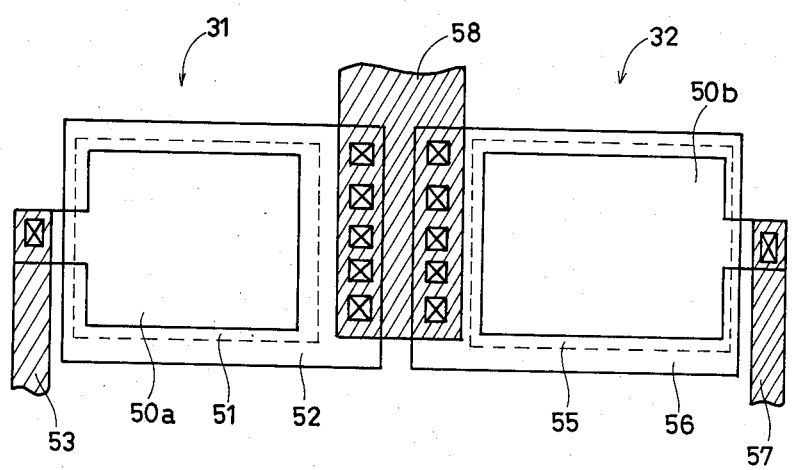
FIG. 7A is a view showing a plane arrangement of a capacitance circuit which constitutes a reference voltage generating circuit in accordance with the present invention.
Figure 7B:
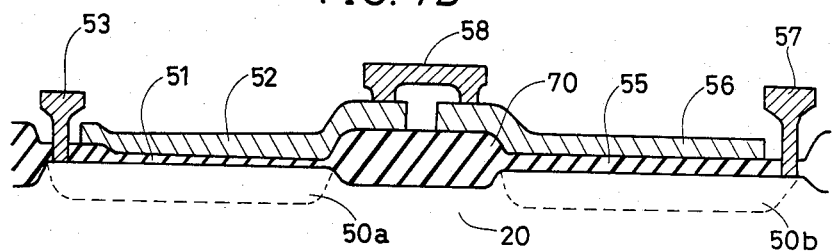
FIG. 7B is a view showing a sectional structure of the capacitance circuit shown in FIG. 7A.

Referring to FIGS. 7A and 7B, a concrete structure of a capacitance circuit for dividing the output from the constant voltage supply circuit 30 will be described. FIG. 7A is a view showing a plane arrangement of the capacitance circuit and FIG. 7B is a view showing a sectional structure thereof.

Figure 1:
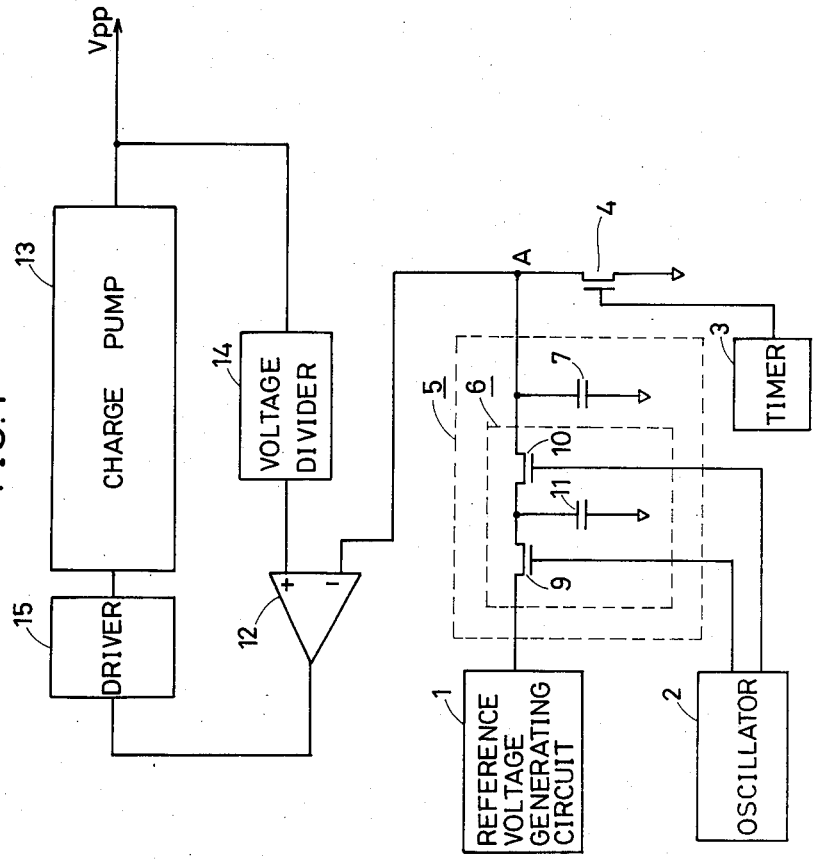
FIG. 1 is a schematic block diagram showing a structure of a conventional programming high-voltage pulse generator.
Figure 2:
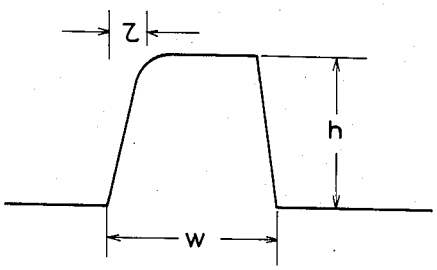
FIG. 2 is a diagram showing a waveform of a programming high-voltage pulse generated from the circuit shown in FIG. 1.
Figure 3:
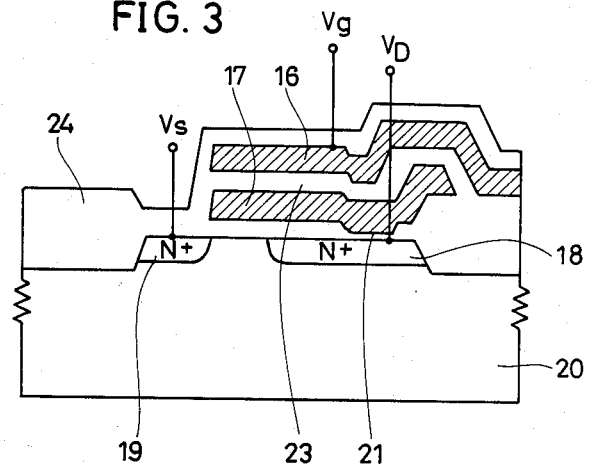
FIG. 3 is a sectional view showing schematically a structure of a memory transistor of an EEPROM.

The capacitor 31 comprises: an active region 50a formed in a predetermined region of a semiconductor substrate 20; a first oxide film 51 formed on the active region 50a by the same manufacturing process as for a tunnel oxide film (indicated as 21 in FIG. 3) of a memory transistor and having the same thickness as that of the tunnel oxide film; and a first polysilicon film 52 formed on the first oxide film 51 by the same manufacturing process as for a floating gate (indicated as 17 in FIG. 3) of the memory transistor.

The capacitor 32 comprises: an active region 50b formed in a predetermined region of the semiconductor substrate 20; a second oxide film 55 formed on the active region 50b by the same manufacturing process as for a gate oxide film of a MOS transistor in an EEPROM; and a second polysilicon film 56 formed on the second oxide film 55 by the same manufacturing process as for a gate electrode of the MOS transistor (or a control gate of a memory transistor).

The first oxide film 51 and the second oxide film 55 are electrically isolated by a thick oxide film 70.

The active region 50a receives an output of the constant voltage supply circuit through an aluminum electrode connection 53. The first polysilicon film 52 and the second polysilicon film 56 are connected on the thick oxide film 70 by means of an aluminum interconnection 58. The active region 50b is grounded through an aluminum connection 57. The aluminum interconnection 58 transmits an output of the capacitors circuit.

With the above described arrangement, a voltage output according to the thickness of the tunnel oxide film can be provided.

Figure 8:
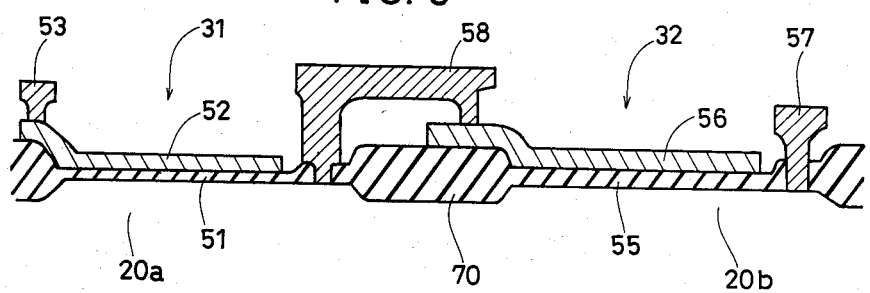
FIG. 8 is a sectional view showing another structure of a capacitance circuit.

FIG. 8 is a sectional view showing another structure of a capacitors circuit. In FIG. 8, the capacitor 31 comprises: a first polysilicon film 52 formed by the same manufacturing process as for a floating gate of a memory transistor and receiving an output of the constant voltage supply circuit through an aluminum interconnection 53, a first oxide film 51 formed under the first polysilicon film 52 by the same manufacturing process as for a tunnel oxide film; and a semiconductor substrate 20a formed under the first oxide film 51.

The capacitor 32 comprises: a second polysilicon film 56 connected through an Al interconnection 58 to a semiconductor substrate 20a of one electrode of the capacitor 31; a second oxide film 55 formed under the second polysilicon film 56 by the same manufacturing process as for a gate oxide film of a MOS transistor, the semiconductor substrate 20b under the second oxide film 55, the semiconductor substrate 20b being grounded through an aluminum connection 57. The second polysilicon film 56 is formed preferably by the same manufacturing process as for a control gate of a memory transistor. The output of the capacitors circuit is supplied through the aluminum connection 58.

Now, description will be given to the operation of a programming high-voltage pulse generator in accordance with an embodiment of the present invention. For the purpose of comparing this embodiment with the case of using a conventional reference voltage generating circuit, the respective parameters are selected so that the designed thickness of the tunnel oxide film is 90 Å, the optimum voltage of the pulse $V_{pp}$ is 21 V and the threshold voltage shift amount $\Delta V_{th}$ is 3 V at a pulse width of 2 milliseconds. In order to satisfy these conditions, the division ratio of the voltage divider 14 is set to 1/7 and a capacitance ratio of the capacitances 31 and 32 and a gain of the inverter 33 are made to have the optimum values so that 3 V may be obtained as the output voltage of the inverter 33 in so far as the EEPROM is manufactured as designed.

Figure 4:
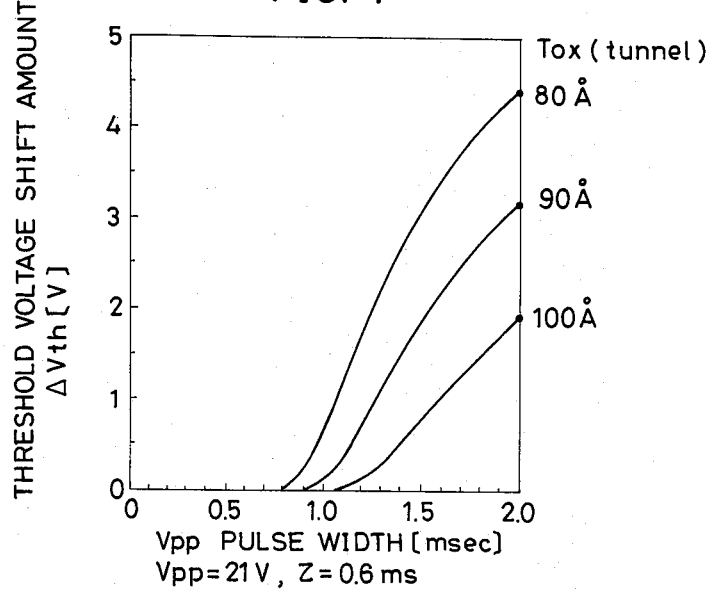
FIG. 4 is a graph showing the result obtained by computer simulation concerning a relation between a threshold voltage shift amount of a memory transistor and a thickness of a tunnel oxide film in the case of using the circuit shown in FIG. 1.
Figure 5:
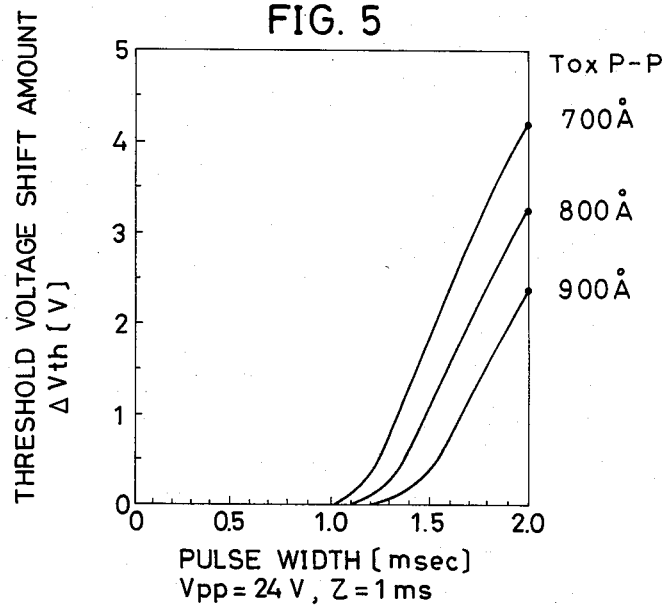
FIG. 5 is a graph showing the result obtained by computer simulation concerning a relation between a threshold voltage shift amount of a memory transistor and a thickness of oxide film between a control gate and a floating gate in the case of using the circuit shown in FIG. 1.

In the above described circuit construction, if the thickness of the tunnels oxide film becomes thinner than the designed value, the capacitance of the capacitor 31 comprised of an oxide film formed by the same manufacturing process as for the tunnel oxide film becomes larger. As a result, the potential at the junction of the capacitors 31 and 32 is slightly increased. Consequently, the output potential of the inverter 33 is slightly decreased and the voltage of the high-voltage pulse $V_{pp}$ generated at this time is lowered. In a conventional circuit construction, if the pulse signal $V_{pp}$ of 21 V is applied to the memory transistor, the threshold voltage shift amount $\Delta V$th is 4.5 V according to a change of the thickness of the tunnel oxide film from 90 Å to 80 Å and a difference in the threshold value change amount $\Delta V$th is 1.5 V (see FIG. 4). In this embodiment, by lowering the voltage of the programming high-voltage pulse $V_{pp}$ as described above according to the thickness of the tunnel oxide film, it is made possible to decrease a difference in the threshold voltage shift amount $\Delta V$th.

If the thickness of the tunnel oxide film is as thick as 100 Å, the threshold voltage shift amount $\Delta V$th is only 2 V (see FIG. 4) in the case of the pulse $V_{pp}$ of 21 V, while in the circuit construction of this embodiment of the present invention, the capacitance of the capacitor 31 is decreased according to the thickness of the tunnel oxide film and the input voltage of the inverter 33 is lowered. Consequently, the output level of the inverter 33 is increased and accordingly the voltage of the pulse $V_{pp}$ is increased. Thus, the threshold voltage shift amount $\Delta V$th becomes higher than 2 V, which makes it possible to decrease a shift amount $\Delta V$th. As described above, in this embodiment of the invention, it is made possible to decrease the variance range of the threshold voltage shift amount $\Delta V$th due to a change of the thickness of the tunnel oxide film. The above discussion will be verified in the following using computer simulation.

Figure 9:
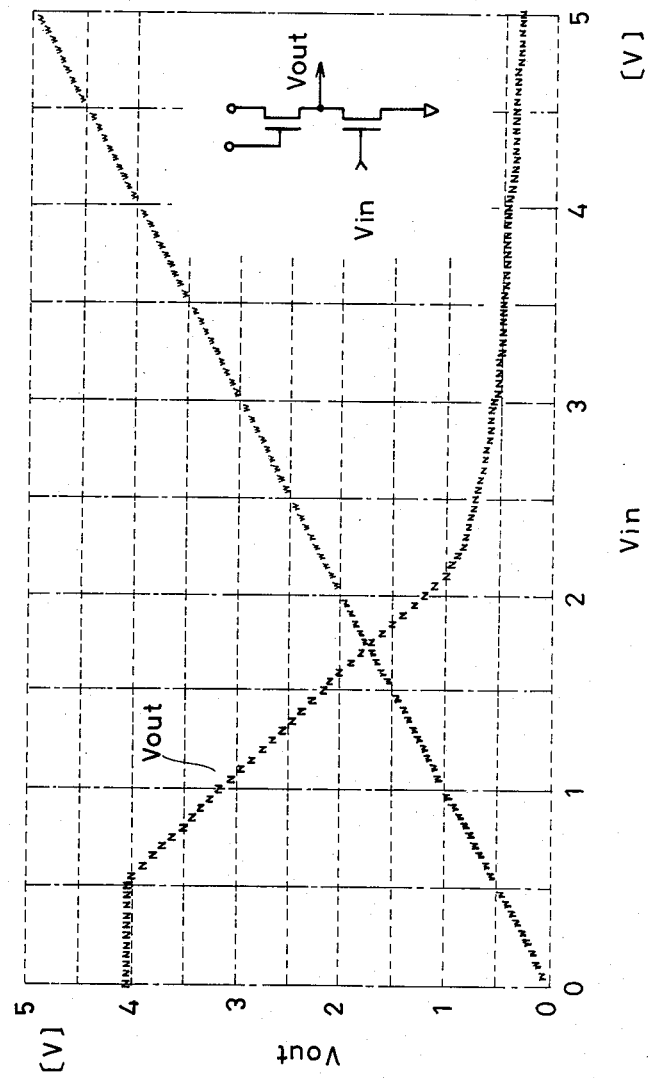
FIG. 9 is a graph showing input and output characteristics of an inverter used in a reference voltage generating circuit in accordance with the present invention.

FIG. 9 is a graph showing the input and output characteristics of the inverter 33. In FIG. 9, the horizontal axis represents an input voltage $V_{IN}$ and the vertical axis represents an output voltage $V_{OUT}$, with a curve representing input and output characteristics. The size of the MOS transistors 34 and 35 is most suitably set so as to meet the conditions of the input and output characteristics shown in FIG. 9. Now, referring to FIGS. 6 and 9, the result obtained by computer simulation using a SPICE 2 will be described. This simulation takes into account, not only a capacitance division but also influences such as a parasitic capacitance in the connections and other regions. In this case, the output of the constant voltage supply circuit 30 is set at 4 V.

Assuming that the capacitance value of the capacitor 31 comprised of an oxide film formed by the same manufacturing process as for the tunnel oxide film is 1.0 $_pF$ with the thickness of the tunnel oxide film being 90 Å and that the capacitance of the capacitor 32 is 3.55 $_pF$, the output obtained from the inverter 33 is 3 V. If the thickness of the tunnel oxide film is as thin as 80 Å, the capacitance of the capacitor 31 is 1.125 $_pF$ and in this case, the input of the inverter 33 is 1.18 V and the output thereof is 2.80 V. The voltage of the pulse $V_{pp}$ in this case is 19.6 V.

On the other hand, if the thickness of the tunnel oxide film is as thick as 100 Å, the capacitance of the capacitor 31 is 0.9 $_pF$ and the output of the inverter 33 is 0.99 V and the output thereof is 3.16 V. The voltage of the pulse signal $V_{pp}$ in this case is 22.1 V.

Figure 10:
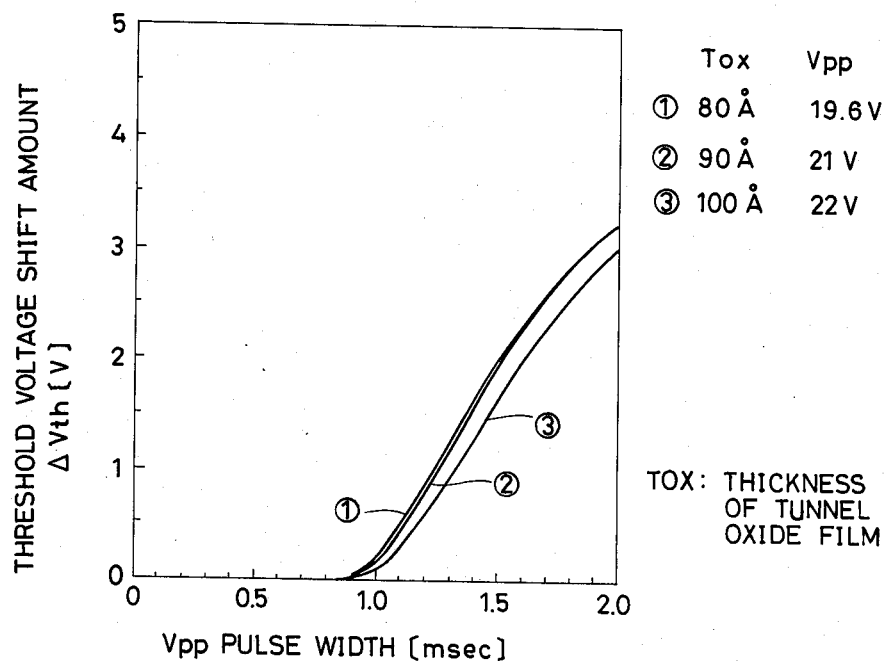
FIG. 10 is a graph showing the result obtained by computer simulation concerning a relation between a threshold voltage shift amount of a memory transistor and a thickness of a tunnel oxide film in the case of using a reference voltage generating circuit in accordance with the present invention.

FIG. 10 is a graph showing a threshold value shift amount $\Delta V$th of a memory transistor in the case of using a reference voltage generating circuit of an embodiment of the present invention. As is clear from the comparison between FIGS. 4 and 10, in this embodiment of the invention, the threshold voltage shift amount $\Delta V$th with the tunnel oxide film having a thickness of 80 Å (shown by the curve 1) is equal to the threshold voltage shift amount $\Delta V$th with the tunnel oxide film having a thickness of 90 Å (shown by the curve 2) and if the thickness of the tunnel oxide film is increased to 100 Å (as shown by the curve 3 ), a difference in the threshold voltage shift amount $\Delta V$th is only as small as about 0.2 V. Thus good effects can be obtained.

Although in the above described embodiment, the capacitor 31 is comprised of an oxide film formed by the same manufacturing process as for the tunnel oxide film, the capacitor 31 may be comprised of an oxide film formed by the same manufacturing process as for the interlayer oxide film between the floating gate and the control gate. In this latter case, in the same manner as in the above explanation, it is made possible to decrease a variance range of the threshold voltage shift amount $\Delta V$th due to a variation in the thickness of the interlayer oxide film between the control gate and the floating gate.

In addition, the capacitor 31 may be formed by connecting in electrically parallel an oxide film formed by the same manufacturing process as for the tunnel oxide film and an oxide film formed by the same manufacturing process as for the control gate-floating gate interlayer oxide film. In this case, it is made possible to suppress a change in the threshold value shift amount $\Delta V$th due to changes in the thicknesses of both films.

Figure 11:
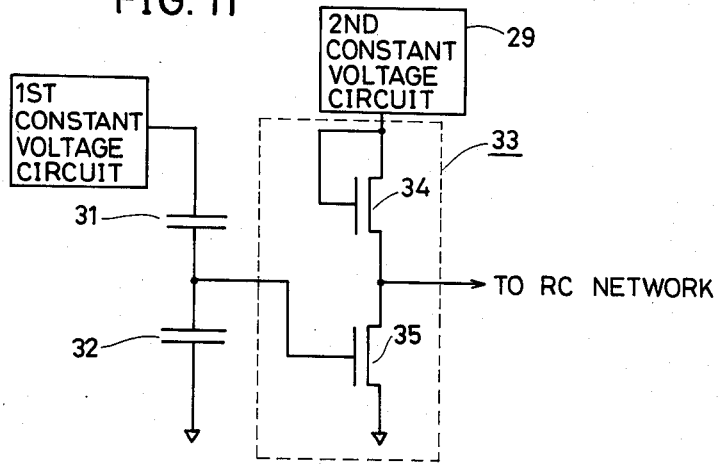
FIG. 11 is a circuit diagram of an inverter used in the block diagram of FIG. 6.

Since in the above described embodiment, as the power supply of the inverter 33 is used the power supply of the EEPROM, influences on the output of the inverter due to a change in the power supply voltage cannot be avoided. Therefore, it is effective to provide another constant voltage supply circuit as a power supply of the inverter 33, as shown in FIG. 11.

Thus, according to the present invention, the reference voltage signal level for determining the level of the pulse $V_{pp}$ is made to automatically change according to the thickness of the tunnel oxide film or the polysilicon-polysilicon interlayer oxide film or the thicknesses of both films and accordingly, if there is a change in the thickness of the tunnel oxide film or the polysilicon-polysilicon interlayer oxide film or both of the films, a change in the threshold voltage shift amount of the memory transistor can be decreased to minimum.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with a programming high-voltage pulse generator in an electrically erasable and programmable read-only semiconductor memory device comprising data storage means including a plurality of memory transistors, each of said memory transistors comprising a semiconductor substrate, a floating gate for storing electric charges and a tunnel oxide film formed between said semiconductor substrate and said floating gate to serve as a path for electric charges, means for programming said data storage means using a programming high-voltage pulse signal, said programming high-voltage pulse generator comprising means for controlling the pulse height of the programming high-voltage pulse, and signal amplifying means for producing said programming high-voltage pulse in response to said controlling means, said pulse height controlling means comprising:

means for generating a reference signal of a predetermined potential, voltage dividing means including a first capacitance formed of an oxide film having a thickness corresponding to the thickness of said tunnel oxide film and a second capacitance having a predetermined capacitance value, said first capacitance and said second capacitance being connected in series, one end of said first capacitance not connected to said second capacitance receiving the reference signal from said reference signal generating means and an output signal being provided from a junction of said first and second capacitance, and correcting means responsive to the output signal received from said voltage dividing means for providing an output voltage to said signal amplifying means.

2. A semiconductor device as set forth in claim 1, wherein said memory device comprises MOS transistors each having a gate oxide film and said second capacitance is formed of an oxide film formed by the same manufacturing process as for said gate oxide film.

3. A semiconductor device as set forth in claim 1, wherein the oxide film forming said first capacitance is formed by the same manufacturing process as for said tunnel oxide film.

4. A semiconductor device as set forth in claim 1, wherein said correcting means comprises an inverter connected between said junction and said signal amplifying means, said inverter further comprising MOS transistors.

5. A semiconductor device with a programming high-voltage pulse generator in an electrically erasable and programmable read-only semiconductor memory device comprising data storage means including a plurality of memory transistors, each of said memory transistors comprising a semiconductor substrate, a control electrode, a floating gate for storing electric charges according to the voltage applied to said control electrode and a first oxide film formed between said control electrode and said floating gate; and programming means for programming said data storage means using a programming high-voltage pulse signal; said programming high-voltage pulse generator comprising means for controlling the Pulse height of the programming high-voltage pulse, and signal amplifying means to produce said programming high-voltage pulse responsive to said controlling means, said pulse height controlling means comprising:

means for generating a reference signal of a predetermined potential, voltage dividing means including a first capacitance formed of an oxide film having a thickness corresponding to the thickness of said first oxide film and a second capacitance having a predetermined capacitance value, said first capacitance and said second capacitance being connected in series, one end of said first capacitance not connected to said second capacitance receiving the reference signal from said reference signal generating means and an output signal being provided from a junction of said first and second capacitance, and correcting means responsive to the output signal received from said voltage dividing means for providing an output voltage signal to said signal amplifying means.

6. A semiconductor device as set forth in claim 5, wherein said memory device comprises MOS transistors each having a gate oxide film and said second capacitance is formed by the same manufacturing process as for said gate oxide film.

7. A semiconductor device as set forth in claim 5, wherein the oxide film forming said first capacitance is formed by the same manufacturing process as for said first oxide film.

8. A semiconductor device as set forth in claim 5, wherein said correcting means comprises an inverter connected between said junction and said signal amplifying means, said inverter further comprising MOS transistors.

9. A semiconductor device with a programming high-voltage pulse generator in an electrically erasable and programmable read-only semiconductor memory device comprising data storage means including a plurality of memory transistors, each of said memory transistors comprising a semiconductor substrate, a control electrode, a floating gate for storing electric charges according to the voltage applied to said control electrode, a tunnel oxide film formed between said semiconductor substrate and said floating gate to serve as a path for electric charges and a first oxide film formed between said control electrode and said floating gate, means for programming said data storage means using a high-voltage pulse signal, said high-voltage pulse generator comprising means for controlling the pulse height of the high-voltage pulse, and signal amplifying means responsive to said controlling means for producing said programming high-voltage, said pulse height controlling means comprising:

means for generating a reference signal of a predetermined potential, voltage dividing means including a first capacitance formed by connecting in parallel, a capacitance formed of an oxide film having a thickness corresponding to the thickness of said tunnel oxide film and a capacitance formed of an oxide film having a thickness corresponding to the thickness of said first oxide film and a second capacitance having a predetermined capacitance value, said first capacitance and said second capacitance being connected in series, one end of said first capacitance not connected to said second capacitance receiving the reference signal from said reference signal generating means and an output signal being provided from a junction of said first and second capacitance, and correcting means responsive to the output signal received from said voltage dividing means for providing an output voltage signal to said signal amplifying means.

10. A semiconductor device as set forth in claim 9, wherein said memory device comprises MOS transistors each having a gate oxide film and said second capacitance is formed by the same manufacturing process as for said gate oxide film.

11. A semiconductor device as set forth in claim 9, wherein the oxide film having a thickness corresponding to the thickness of said tunnel oxide film and the oxide film having a thickness corresponding to the thickness of said first oxide film are formed by the same manufacturing process as for said tunnel oxide film and the same manufacturing process as for said first oxide film, respectively.

12. A semiconductor device as set forth in claim 9, wherein said correcting means comprises an inverter connected between said junction and said signal amplifying means, said inverter further comprising MOS transistors.

* * * * *